(12) United States Patent
Uchiyama et al.

(10) Patent No.: US 11,291,111 B2
(45) Date of Patent: Mar. 29, 2022

(54) FLEXIBLE WIRING SUBSTRATE, ELECTRO-OPTICAL DEVICE, AND ELECTRONIC APPARATUS

(71) Applicant: SEIKO EPSON CORPORATION, Tokyo (JP)

(72) Inventors: Suguru Uchiyama, Suwa (JP); Yoshitaka Hama, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 28 days.

(21) Appl. No.: 16/996,149

(22) Filed: Aug. 18, 2020

(65) Prior Publication Data

US 2021/0059040 A1    Feb. 25, 2021

(30) Foreign Application Priority Data

Aug. 19, 2019   (JP) .............................. JP2019-149680

(51) Int. Cl.
| | | |
|---|---|---|
| *H05K 1/00* | (2006.01) | |
| *H05K 1/02* | (2006.01) | |
| *H05K 1/03* | (2006.01) | |
| *G02F 1/1345* | (2006.01) | |
| *H05K 1/18* | (2006.01) | |
| *H01L 27/32* | (2006.01) | |
| *G02B 27/01* | (2006.01) | |

(52) U.S. Cl.
CPC ......... *H05K 1/028* (2013.01); *G02F 1/13452* (2013.01); *H05K 1/0346* (2013.01); *H05K 1/189* (2013.01); *G02B 27/017* (2013.01); *H01L 27/3276* (2013.01); *H01L 27/3288* (2013.01); *H05K 2201/10136* (2013.01)

(58) Field of Classification Search
CPC ...... H05K 1/028; H05K 1/0346; H05K 1/189; H05K 2201/10136; G02F 1/13452; G02B 27/017; H01L 27/3276; H01L 27/3288
USPC ........................................................ 361/750
See application file for complete search history.

(56) References Cited

U.S. PATENT DOCUMENTS

| | | | | |
|---|---|---|---|---|
| 4,587,399 | A * | 5/1986 | Higeta ..................... | B41J 2/345 347/207 |
| 6,373,544 | B1 | 4/2002 | Hirabayashi | |
| 2015/0029684 | A1* | 1/2015 | Park ....................... | H05K 1/028 361/749 |
| 2017/0236860 | A1* | 8/2017 | Yamamoto ........ | H01L 27/14632 257/432 |
| 2019/0363267 | A1* | 11/2019 | Tanaka ..................... | G09F 9/30 |

FOREIGN PATENT DOCUMENTS

| | | |
|---|---|---|
| JP | H11-72804 A | 3/1999 |
| JP | 2008-159749 A | 7/2008 |
| JP | 2010-165848 A | 7/2010 |

* cited by examiner

*Primary Examiner* — Andargie M Aychillhum
(74) *Attorney, Agent, or Firm* — Oliff PLC

(57) ABSTRACT

A flexible wiring substrate includes a main substrate having flexibility, a main wiring disposed over the main substrate, a second protective sheet covering the main wiring, and an insulating member partially covering the main wiring exposed from the second protective sheet and being thinner in thickness than the second protective sheet.

10 Claims, 5 Drawing Sheets

FLEXIBLE WIRING SUBSTRATE, ELECTRO-OPTICAL DEVICE, AND ELECTRONIC APPARATUS

The present application is based on, and claims priority from JP Application Serial Number 2019-149680, filed Aug. 19, 2019, the disclosure of which is hereby incorporated by reference herein in its entirety.

BACKGROUND

1. Technical Field

The present disclosure relates to a flexible wiring substrate, an electro-optical device, and an electronic apparatus.

2. Related Art

A reflective liquid crystal panel as an electro-optical device is disclosed in JP 11-72804 A. The document describes that the electro-optical device includes a flexible tape wiring as a flexible wiring substrate. The flexible wiring substrate is a wiring substrate having flexibility in which a conductive wiring is formed on a base substrate of a film-like shape, and includes, at an end portion of the flexible wiring substrate, a connection portion having a connection wiring in a stripe shape. In addition, a protective member of a tape-like shape is bonded together to the base substrate to ensure insulating properties, and the connection portion is exposed from the protective member.

The electro-optical device, which is a reflective liquid crystal panel, does not need to have a substrate having translucency, and uses a silicon substrate. At an end portion of the silicon substrate, a connection terminal portion is formed as a panel-side terminal for electrically coupling with the connection portion of the flexible wiring substrate. The connection terminal portion of the silicon substrate is coupled with the connection portion of the flexible wiring substrate via an anisotropic conductive film.

However, a known flexible wiring substrate has an issue in that a wiring short-circuiting may possibly occur when coupling with the silicon substrate. Specifically, in the silicon substrate as a semiconductor, a short-circuiting may occur when the connection portion of the flexible wiring substrate makes contact with an edge portion of the silicon substrate. It is also conceivable to elongate a covering of the protective member to make an exposed length of the connection portion short, however, in such a case, there is a possibility that the risk of mounting failure increases. Specifically, due to thick thickness and affixing inaccuracy of the protective member composed of polyimide or the like, the protective member may overlap, when coupling by the anisotropic conductive film, with the connection terminal portion of the silicon substrate, resulting in a connection failure.

SUMMARY

A flexible wiring substrate includes a base member having flexibility, a wiring disposed over the base member, a protective member covering the wiring, and an insulating member partially covering the wiring exposed from the protective member, and being thinner in thickness than the protective member.

In the flexible wiring substrate described above, in plan view of the base member, the insulating member may partially overlap the protective member.

In the flexible wiring substrate described above, the insulating member may cover a side face of the protective member.

In the flexible wiring substrate described above, the insulating member may include a photosensitive resin material.

In the flexible wiring substrate described above, the insulating member may include a solder resist.

In the flexible wiring substrate described above, the flexible wiring substrate my include a plurality of terminals, and the insulating member may be provided along a direction in which the plurality of terminals are aligned.

In the flexible wiring substrate described above, the protective member may include a polyimide.

An electro-optical device includes an electro-optical panel including a semiconductor substrate and a panel-side terminal provided along one side of the semiconductor substrate, and the flexible wiring substrate described above, in which a wiring of the flexible wiring substrate is electrically coupled with the panel-side terminal.

In the electro-optical device described above, the insulating member included in the flexible wiring substrate may contact a corner portion of a side face of the semiconductor substrate.

An electronic apparatus includes the electro-optical device described above.

DESCRIPTION OF EXEMPLARY EMBODIMENTS

First Embodiment

Figure 1:
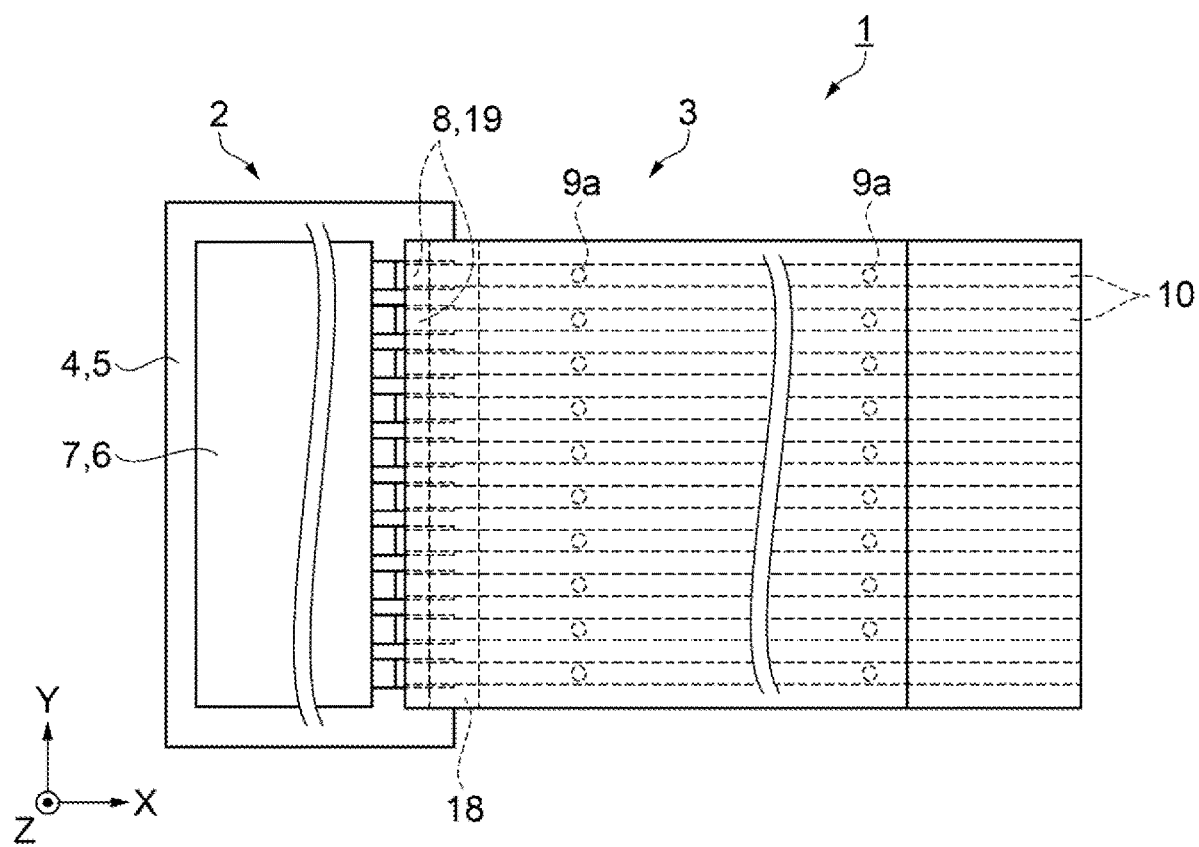
FIG. 1 is a plan view schematically illustrating a structure of an electro-optical device in which a flexible wiring substrate according to a first embodiment is disposed.
Figure 2:
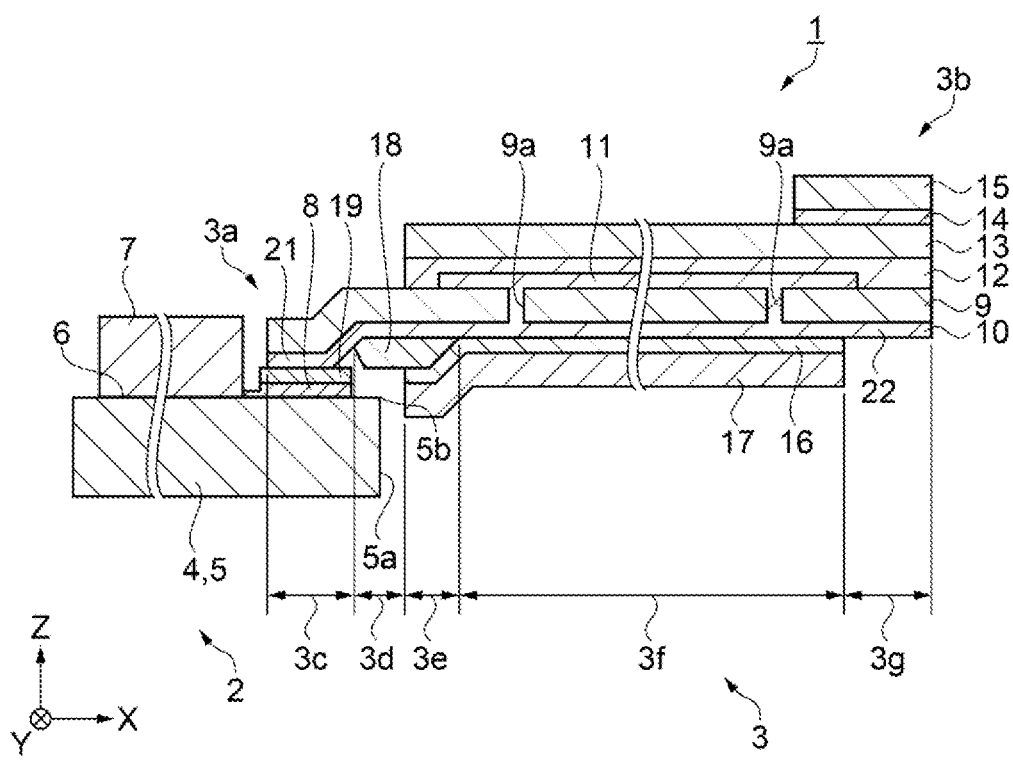
FIG. 2 is a side cross-sectional view schematically illustrating a structure of an electro-optical device in which a flexible wiring substrate is disposed.

In a first embodiment, a distinguishing example of an electro-optical device in which a flexible wiring substrate is disposed will be described with reference to the drawings. The electro-optical device according to the first embodiment is described with reference to FIGS. 1 to 2. FIG. 1 is a plan view schematically illustrating a structure of the electro-optical device in which the flexible wiring substrate is disposed. FIG. 2 is a side cross-sectional view schematically illustrating the structure of the electro-optical device in which the flexible wiring substrate is disposed.

As illustrated in FIGS. 1 and 2, an electro-optical device 1 includes an electro-optical panel 2 and a flexible wiring substrate 3. The electro-optical panel 2 includes a main body portion 4. The main body portion 4 includes a silicon substrate 5 as a semiconductor substrate that forms an external shape. The silicon substrate 5 is a plate having a quadrangular shape as a planar shape. The directions in which two adjacent sides of the quadrangular shape extend are referred to as "X direction" and "Y direction". A thickness direction of the silicon substrate 5 is referred to as "Z direction". The X direction, the Y direction, and the Z direction are orthogonal to one another. The direction in which the flexible wiring substrate 3 is disposed with respect to the electro-optical panel 2 is referred to as "+X direction".

A light-emitting unit 6 is disposed at a face on a side in the +Z direction of the silicon substrate 5. In the light-emitting unit 6, there are arrayed organic EL elements configured by containing an organic EL (Electronic Luminescent) material in a matrix pattern. Each of the organic EL elements emits color light in the +Z direction. The organic EL element is also referred to as OLED (Organic light-emitting diodes) element. The light-emitting unit 6, which controls a color and an intensity of light in each of the organic EL elements, displays a video picture. A protective glass 7 is disposed on a side in the +Z direction of the light-emitting unit 6. The protective glass 7 cooperates with the silicon substrate 5 to seal the light-emitting unit 6.

In the electro-optical panel 2, a plurality of panel-side terminals 8 are arranged at a face in the +X direction, which is in the +Z direction of the silicon substrate 5. The panel-side terminal 8 is provided along a one side of the silicon substrate 5. The panel-side terminals 8 are aligned side by side in the +Y direction. The panel-side terminal 8 is a terminal for inputting an electrical signal such as an image signal to be sent to the light-emitting unit 6. Although the number of the panel-side terminals 8 is not limited, 10 pieces of the panel-side terminals 8 are described in the drawing to make the drawings easier to see.

The flexible wiring substrate 3 has a longer length in the X direction. An end on a side in the −X direction of the flexible wiring substrate 3 is referred to as "first end 3a", and an end on a side in the +X direction is referred to as "second end 3b". The first end 3a is electrically coupled with the electro-optical panel 2. The second end 3b is electrically coupled with a control board or the like for controlling the electro-optical panel 2.

The flexible wiring substrate 3 includes a main substrate 9 as a base member. The main substrate 9, which is formed of a resin film such as a polyimide, has flexibility. The main substrate 9 is disposed from the first end 3a to the second end 3b. A main wiring 10 as a plurality of wirings is disposed, on the main substrate 9, at a face on a side in the −Z direction of the main substrate 9. The number of the main wirings 10 is the same as the number of the panel-side terminals 8. As illustrated in FIG. 1, a pitch between the main wirings 10 in the Y direction is the same as the pitch between the panel-side terminals 8. The main wiring 10 is formed of a metal foil such as a copper foil or the like. The main wiring 10 is disposed from the first end 3a to the second end 3b.

The main body portion 4 is adhesively fixed to the flexible wiring substrate 3 by an anisotropic conductive film 19 at the first end 3a. Each of the main wirings 10 is electrically coupled with each of the panel-side terminals 8. The main wiring 10 of the flexible wiring substrate 3 is electrically coupled with the panel-side terminal 8.

A sub-wiring 11 is disposed at a face on a side in the +Z direction of the main substrate 9. The main wiring 10 is disposed overlapping in a plan view of the flexible wiring substrate 3 with the sub-wiring 11. The sub-wiring 11 is shorter in length in the X direction than the main wiring 10. At the main substrate 9, a through hole 9a passing through the main substrate 9 in the thickness direction is formed. Each of the main wirings 10 is electrically coupled with each of the sub-wirings 11 by a metal plating such as a copper plating at the through hole 9a. The main wiring 10 is disposed in parallel to the sub-wiring 11, to thus enable an impedance control at flexible printed circuits (FPC) for high-speed transmission.

At faces on a side in the +Z direction of the main substrate 9 and the sub-wiring 11, a first protective sheet 13 is disposed via a first adhesive 12. The first adhesive 12 causes the first protective sheet 13 to be adhesively fixed to the main substrate 9. The first adhesive 12 and the first protective sheet 13 cover the sub-wiring 11 to provide electrical, mechanical, and chemical protections. The first protective sheet 13 is formed of a resin film such as a polyimide.

At a face on a side in the +Z direction of the first protective sheet 13, a reinforcing plate 15 is disposed via a second adhesive 14. The second adhesive 14 causes the reinforcing plate 15 to be adhesively fixed to the first protective sheet 13. The reinforcing plate 15 reinforces the second end 3b to make it hard to bend. The flexible wiring substrate 3 is easily inserted into a socket or the like due to hardness of the second end 3b of the flexible wiring substrate 3.

At faces on a side in the −Z direction of the main substrate 9 and the main wiring 10, a second protective sheet 17 as a protective member is disposed via a third adhesive 16. The third adhesive 16 causes the second protective sheet 17 to be adhesively fixed to the main substrate 9. The second protective sheet 17 covers the main wiring 10 to provide electrical, mechanical, and chemical protections.

The second protective sheet 17 is formed of a resin film containing a polyimide. The polyimide, which has flexibility and high insulating properties, can function as a material for the flexible wiring substrate 3. Further, the flexible wiring substrate 3 comes to warp when a photosensitive resin such as solder resist is disposed at the entire surface in place of the second protective sheet 17. The second protective sheet 17 suppresses warping of the flexible wiring substrate 3.

The third adhesive 16 and the second protective sheet 17 are shorter in length in the X direction than the main substrate 9 and the main wiring 10. The main wiring 10 is exposed from the second protective sheet 17 at the first end 3a and the second end 3b. On the main substrate 9 and the main wiring 10, an insulating member 18 partially covering the main wiring 10 exposed from the second protective sheet 17 and being thinner in thickness than the second protective sheet 17 is disposed.

The insulating member 18 contains a photosensitive resin material. A photosensitive resin is cured by being irradiated with light. Because the photosensitive resin is cured in a short time compared to a thermosetting resin, the insulating member 18 can be disposed with high productivity.

The insulating member 18 contains a solder resist. The solder resist can be easily applied by printing. Thus, the insulating member 18 can be disposed with high productivity.

Specifically, a face on a side in the −Z direction of the flexible wiring substrate 3 differs in conformation from one another in five regions. A region on a side of the first end 3a is referred to as "first region 3c". The main wiring 10 is exposed in the first region 3c. The main wiring 10 at a part exposed in the first region 3c is referred to as "first terminal 21" as a terminal. The first terminal 21 is electrically coupled with the panel-side terminal 8. The flexible wiring substrate 3 includes a plurality of the first terminals 21, and the plurality of the first terminals 21 are aligned along a side face 5a of the silicon substrate 5 in a similar manner as the panel-side terminals 8.

A region adjacent to a side of the second end 3b in the first region 3c is referred to as "second region 3d". In the second region 3d, the insulating member 18 covers the main wiring 10. The insulating member 18 is provided along a direction in which the plurality of the first terminals 21 are aligned. The insulating member 18 is disposed along the side face 5a of the silicon substrate 5. When the flexible wiring substrate 3 bends in the thickness direction of the silicon substrate 5, the side face 5a and a corner portion 5b of the silicon substrate 5 make contact with the insulating member 18. Thus, in the electro-optical device 1, the main wiring 10 can be prevented from making contact with the side face 5a and the corner portion 5b of the silicon substrate 5.

The insulating member 18 included in the flexible wiring substrate 3 makes contact with the corner portion 5b of the side face 5a of the silicon substrate 5. Even when the insulating member 18 makes contact with the silicon substrate 5, the main wiring 10 does not make contact with the silicon substrate 5. This prevents the main wiring 10 from being short-circuited through the silicon substrate 5.

A region adjacent to the side of the second end 3b in the second region 3d is referred to as "third region 3e". In the third region 3e, the main wiring 10 is covered by the insulating member 18, the third adhesive 16, and the second protective sheet 17. The insulating member 18 partially overlaps in a plan view of the main substrate 9 with the second protective sheet 17. The main wiring 10, which is covered by one of the insulating member 18 or the second protective sheet 17, can be prevented from being exposed.

A region adjacent to the side of the second end 3b in the third region 3e is referred to as "fourth region 3f". In the fourth region 3f, the main wiring 10 is covered by the third adhesive 16 and the second protective sheet 17. The main wiring 10, which is covered by the second protective sheet 17, can be prevented from being exposed.

A region adjacent to the side of the second end 3b in the fourth region 3f is referred to as "fifth region 3g". In the fifth region 3g, the main wiring 10 is exposed. The main wiring 10 at a part exposed in the fifth region 3g is referred to as "second terminal 22". The second terminal 22 is coupled with the control board or the like for controlling the electro-optical panel 2.

The dimensions of each of the sites are not particularly limited. An example in the first embodiment is given. A thickness of the protective glass 7 is 1 mm. A thickness of the silicon substrate 5 is 0.7 mm. A distance between a face on a side in the +X direction of the protective glass 7 and the side face 5a is 3.5 mm. A length in the X direction of the panel-side terminal 8 is 0.8 mm. A distance between a face on a side in the +X direction of the panel-side terminal 8 and the side face 5a is 0.5 mm. A distance between a face on a side in the −X direction of the second protective sheet 17 and a face in the −X direction of the main substrate 9 is 2.6 mm. A distance between a face on a side in the −X direction of the second protective sheet 17 and a face on a side in the −X direction of the insulating member 18 is 1.5 mm. A variation of a position at which the second protective sheet 17 is affixed to the main substrate 9 is approximately 0.1 mm. Despite the variation at this dimension of the position of the second protective sheet 17 with respect to the main substrate 9, the second protective sheet 17 can be prevented from interfering with the side face 5a of the silicon substrate 5. This makes it possible to prevent the second protective sheet 17 from being clamped between the main substrate 9 and the silicon substrate 5.

Next, an example of a method for manufacturing the flexible wiring substrate 3 will be described. The method for manufacturing the flexible wiring substrate 3 is not limited due to usage of variety of methods. A polyimide sheet serving as a material of the main substrate 9 is prepared. The through hole 9a is formed through the polyimide sheet using a press machine. A copper film is formed on both faces of the main substrate 9 by electrolytic plating.

Next, the copper film is patterned into shapes of the main wiring 10 and the sub-wiring 11. A resin material is disposed by screen printing method in the shapes of the main wiring 10 and the sub-wiring 11 to form a mask. The main wiring 10 and the sub-wiring 11 are formed to have the shapes by etching the copper film to remove the mask. The insulating member 18 is disposed by the screen printing method. The insulating member 18, which is a photocurable resin, is hardened by being irradiated with ultraviolet light. Next, an outer shape of the polyimide sheet having the shapes of the main wiring 10 and the sub-wiring 11 is formed into the shape of the main substrate 9 by the press machine.

The polyimide sheet is formed into shapes of the second protective sheet 17, the first protective sheet 13, and the reinforcing plate 15 using the press machine. The third adhesive 16 is applied to the second protective sheet 17, and the second protective sheet 17 is affixed to the main substrate 9. The first adhesive 12 is applied to the first protective sheet 13, and the first protective sheet 13 is affixed to the main substrate 9. The second adhesive 14 is applied to the reinforcing plate 15, and the reinforcing plate 15 is affixed to the first protective sheet 13. Through the processes described above, the flexible wiring substrate 3 is completed.

The anisotropic conductive film 19 is disposed on the panel-side terminal 8 of the electro-optical panel 2. The anisotropic conductive film 19 is also referred to as "Anisotropic Conductive Film (ACF)". The first terminal 21 of the flexible wiring substrate 3 is disposed on the anisotropic conductive film 19. The panel-side terminal 8 is disposed to overlap in a plan view of the silicon substrate 5 with the first terminal 21. The first region 3c of the flexible wiring substrate 3 is pressed against the silicon substrate 5 to be heated by a heating jig. When a temperature of the heating jig is lowered, the flexible wiring substrate 3 is adhesively fixed to the electro-optical panel 2. Through the processes described above, the electro-optical device 1 is completed.

According to the above configuration, the insulating member 18 is thinner in thickness than the second protective sheet 17 when the insulating member 18 makes contact with the silicon substrate 5, thus the main substrate 9 bends in a small amount. An internal stress generated in the main substrate 9 is also small. This prevents a stress form being applied to a connection portion between the panel-side terminal 8 and the first terminal 21, and thus the connection portion is hardly peeled off.

Disposition of the insulating member 18 makes it possible to separate the second protective sheet 17 from the side face 5a of the silicon substrate 5. This prevents the second protective sheet 17 from overlapping with the panel-side terminal 8 of the silicon substrate 5 to cause a connection failure.

Second Embodiment

Figure 3:
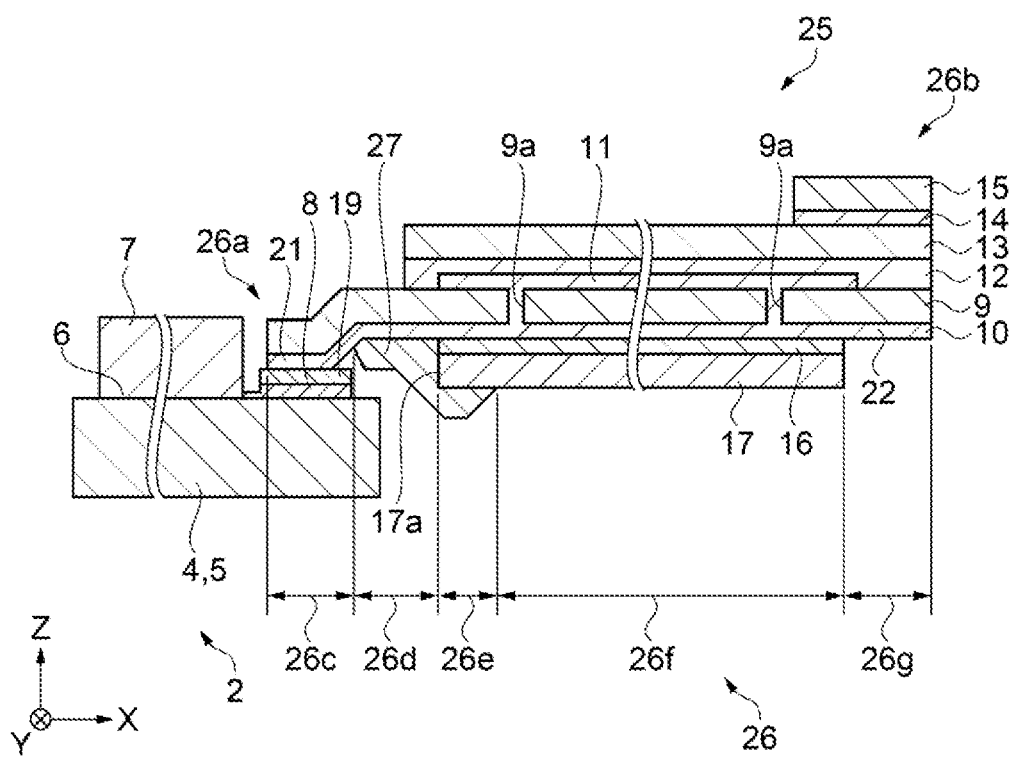
FIG. 3 is a side cross-sectional view schematically illustrating a structure of an electro-optical device in which a flexible wiring substrate according to a second embodiment is disposed.

An embodiment of an electro-optical device in which a flexible wiring substrate is disposed will be described with reference to a side cross-sectional view schematically illustrating the structure of the electro-optical device in which the flexible wiring substrate in FIG. 3 is disposed. A second embodiment differs from the first embodiment in that a shape of the insulating member 18 illustrated in FIG. 2 differs. Note that descriptions for the points identical to those in the first embodiment are omitted.

In the second embodiment, as illustrated in FIG. 3, an electro-optical device 25 includes the electro-optical panel 2 and a flexible wiring substrate 26. The electro-optical panel 2 includes a main body portion 4. The main body portion 4 includes a silicon substrate 5 as a semiconductor substrate that forms an external shape. An end on a side in the −X direction of the flexible wiring substrate 26 is referred to as "first end 26a", and an end on a side in the +X direction is referred to as "second end 26b".

A face of the flexible wiring substrate 26 on a side in the −Z direction is divided into a first region 26c to a fifth region 26g. The first region 26c to the fifth region 26g are regions corresponding to the first region 3c to the fifth region 3g in the first embodiment, respectively. In the second region 26d, an insulating member 27 is disposed at faces on a side in the −Z direction of the main substrate 9 and the main wiring 10. The insulating member 27 corresponds to the insulating member 18 in the first embodiment.

The insulating member 27 covers a side face 17a of the second protective sheet 17. The insulating member 27 also covers an end portion of the second protective sheet 17. The insulating member 27 and the second protective sheet 17, which make contact with each other, can prevent the main wiring 10 from being exposed at a boundary between the insulating member 27 and the second protective sheet 17. In the second region 26d, the insulating member 27 is disposed on the second protective sheet 17 on a side of the first end 26a.

In a process of manufacturing the flexible wiring substrate 26, the insulating member 27 is disposed after the second protective sheet 17 is affixed to the main substrate 9.

Third Embodiment

Figure 4:
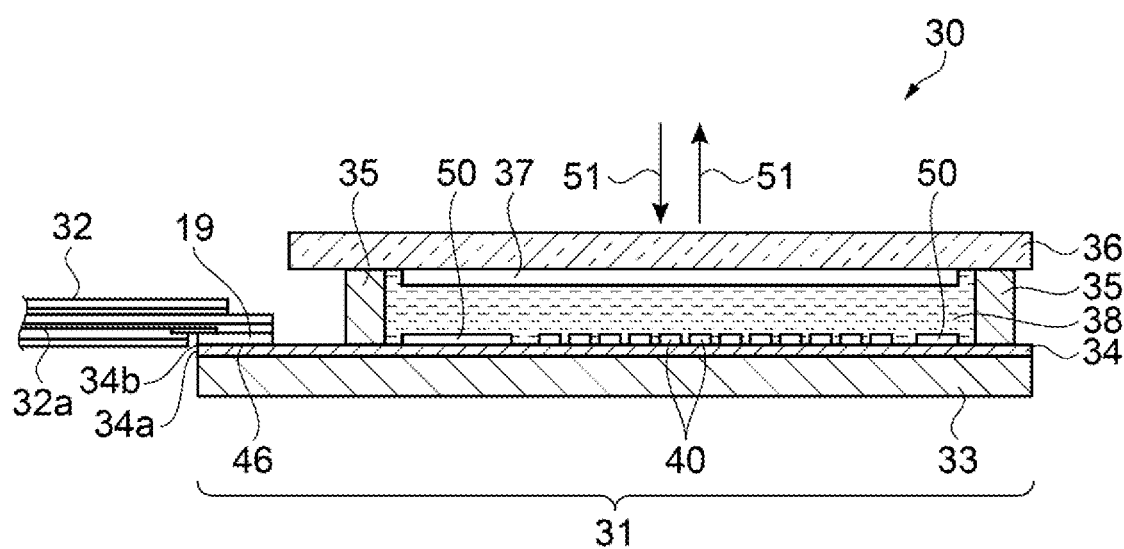
FIG. 4 is a side cross-sectional view schematically illustrating a structure of an electro-optical device in which a flexible wiring substrate according to a third embodiment is disposed.
Figure 5:
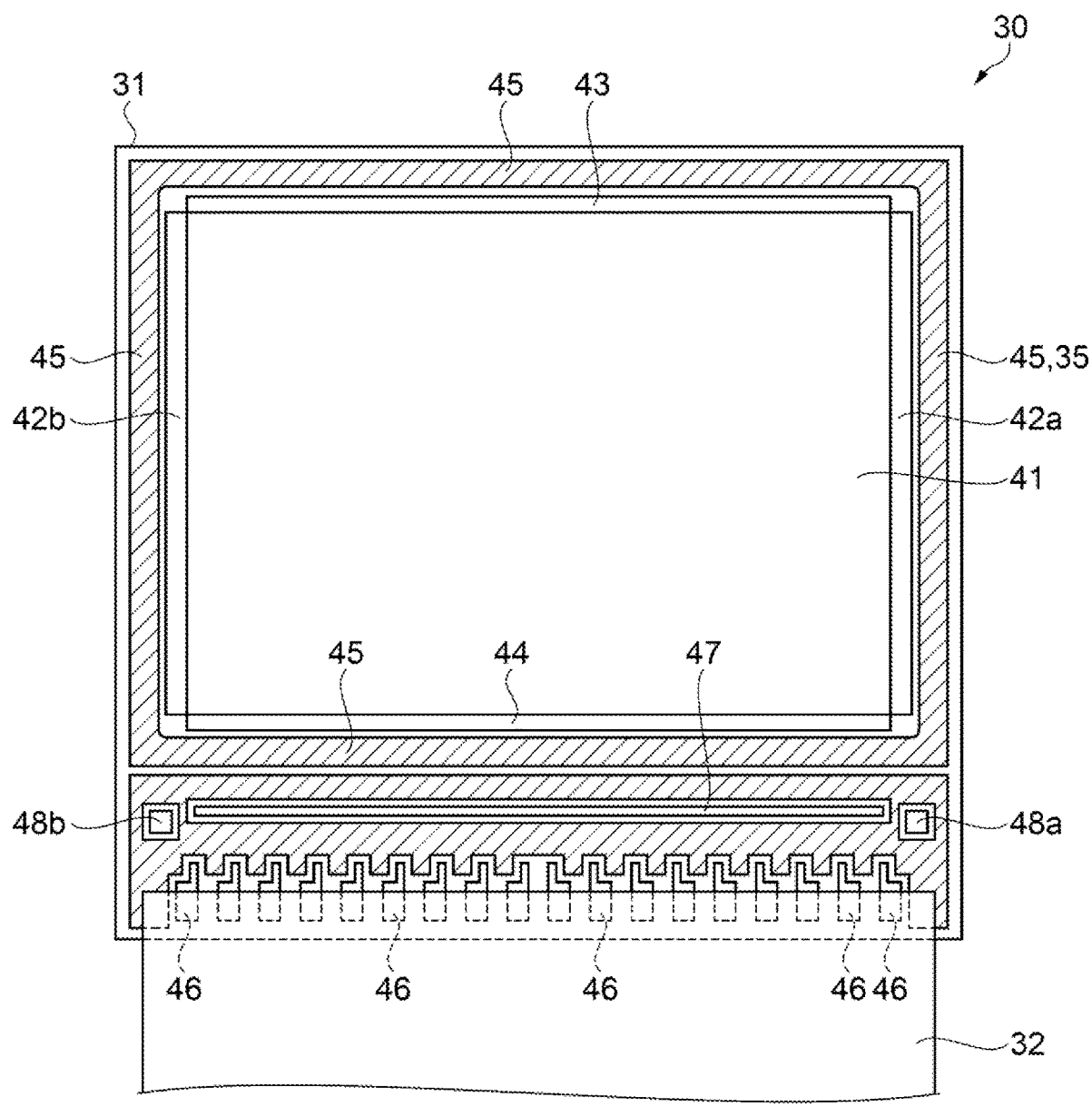
FIG. 5 is a plan view schematically illustrating a structure of an electro-optical device in which a flexible wiring substrate is disposed.

An embodiment of an electro-optical device in which a flexible wiring substrate is disposed will be described with reference to FIGS. 4 and 5. FIG. 4 is a side cross-sectional view schematically illustrating the structure of the electro-optical device in which the flexible wiring substrate is disposed. FIG. 5 is a plan view schematically illustrating the structure of the electro-optical device in which the flexible wiring substrate is disposed. A third embodiment differs from the first embodiment in that the electro-optical device includes a Liquid Crystal On Silicon (LCOS), which is one type of a liquid crystal display device. Note that descriptions for the points identical to those in the first embodiment are omitted.

As illustrated in FIGS. 4 and 5, an electro-optical device 30 includes a liquid crystal panel 31 as an electro-optical panel and a flexible wiring substrate 32. The liquid crystal panel 31 is an LCOS, and is a reflective-type display device. The liquid crystal panel 31 includes a support substrate 33 composed of a glass, a ceramic, or the like, and a substrate for liquid crystal panel 34 as a semiconductor substrate affixed with an adhesive on the support substrate 33. A seal material 35 having a frame shape is disposed on the substrate for liquid crystal panel 34. A glass substrate 36 as a counter substrate is disposed via a spacing facing the substrate for liquid crystal panel 34 with the seal material 35 interposed in between. The glass substrate 36 is at a light incidence side.

A counter electrode 37 composed of a transparent conductive film is disposed at the glass substrate 36 on a side of the substrate for liquid crystal panel 34. A gap sealed by the seal material 35 between the substrate for liquid crystal panel 34 and the glass substrate 36 is filled with an SH-type liquid crystal 38 (Super Homeotropic). The SH-type liquid crystal 38 is in a substantially vertical orientation of the liquid crystal molecules in a state where no voltage is applied.

The substrate for liquid crystal panel 34 includes a pixel region 41 of a rectangular shape in which a plurality of pixel electrodes 40 are arrayed in a matrix pattern. The pixel region 41 is also referred to as "display area". In FIG. 5, a right gate line driving circuit 42a and a left gate line driving circuit 42b that scan a gate line are arranged at an outer side from left and right sides of the pixel region 41.

A precharge and test circuit 43 for data line is disposed on an outer side from an upper side of the pixel region 41. An image signal sampling circuit 44 for supplying an image signal corresponding to image data to a data line is disposed on an outer side from a lower side of the pixel region 41. A seal region 45 having a frame shape for positioning the seal material 35 is disposed on an outer side from the right gate line driving circuit 42a, the left gate line driving circuit 42b, the precharge and test circuit 43, and the image signal sampling circuit 44.

Terminal pads 46 as a plurality of panel-side terminals are aligned along a lower edge of the liquid crystal panel 31. The terminal pads 46 are fixedly coupled to the flexible wiring substrate 32 via the anisotropic conductive film 19. A data line driving circuit 47 is disposed between a row of the terminal pads 46 and the seal region 45. The data line driving circuit 47 supplies an image signal corresponding to the image data to a data line. A right relay terminal pad 48a and a left relay terminal pad 48b are arranged at both sides of the data line driving circuit 47. The right relay terminal pad 48a and the left relay terminal pad 48b supply electric power to the counter electrode 37 of the glass substrate 36.

As illustrated in FIG. 4, a light-shielding film 50 is disposed on the substrate for liquid crystal panel 34. The light-shielding film 50 prevents light from entering the right gate line driving circuit 42a, the left gate line driving circuit 42b, the precharge and test circuit 43, and the image signal sampling circuit 44. The right gate line driving circuit 42a, the left gate line driving circuit 42b, and the data line driving circuit 47 each have a shift register. In response to a transfer of shift data of the shift register, the right gate line driving circuit 42a and the left gate line driving circuit 42b supply a scanning signal to a gate line. The data line driving circuit 47 supplies a sampling signal one by one to the image signal sampling circuit 44. The image signal sampling circuit 44 receives the sampling signal and supplies an image signal to a data line.

The pixel region 41 of the liquid crystal panel 31 is approximately 20 mm square in size. The substrate for liquid crystal panel 34 includes a P-type semiconductor substrate of a single-crystalline silicon. A P-type well region is formed on a surface of the P-type semiconductor substrate. A field oxide film is formed on the P-type well region. This structure is referred to as "local Oxidation of Silicon (LOCOS)". The P-type well region is formed as a common well region in the pixel region 41 in which pixels, such as 768×1024 pixels, for example, are arrayed in a matrix pattern. The common well region of the pixel region 41 is separated from the P-type well region of a part that makes up elements constituting the right gate line driving circuit 42a, the left gate line driving circuit 42b, the precharge and test circuit 43, the image signal sampling circuit 44, and the data line driving circuit 47.

Light 51 being incident on the glass substrate 36 passes through the glass substrate 36 and the SH-type liquid crystal 38 to be reflected by the substrate for liquid crystal panel 34. The light 51 passes through the SH-type liquid crystal 38 and the glass substrate 36 again to be emitted from the glass substrate 36. The light 51 is modulated as passing through the SH-type liquid crystal 38. Because the light 51 is modulated for each of the pixels, an image corresponding to the image signal is displayed in the pixel region 41.

The liquid crystal panel 31 includes the substrate for liquid crystal panel 34 and the terminal pads 46 provided along a one side of the substrate for liquid crystal panel 34. The flexible wiring substrate 3 or the flexible wiring substrate 26 is used for the flexible wiring substrate 32. A wiring 32a of the flexible wiring substrate 32 is electrically coupled with the terminal pad 46. When the flexible wiring substrate 32 bends in a thickness direction of the substrate for liquid crystal panel 34, the insulating member 18 or the insulating member 27 of the flexible wiring substrate 32 makes contact with a corner portion 34b of a side face 34a of the substrate for liquid crystal panel 34. This makes it possible to prevent the wiring 32a of the flexible wiring substrate 32 from making contact with the substrate for liquid crystal panel 34.

Fourth Embodiment

Figure 6:
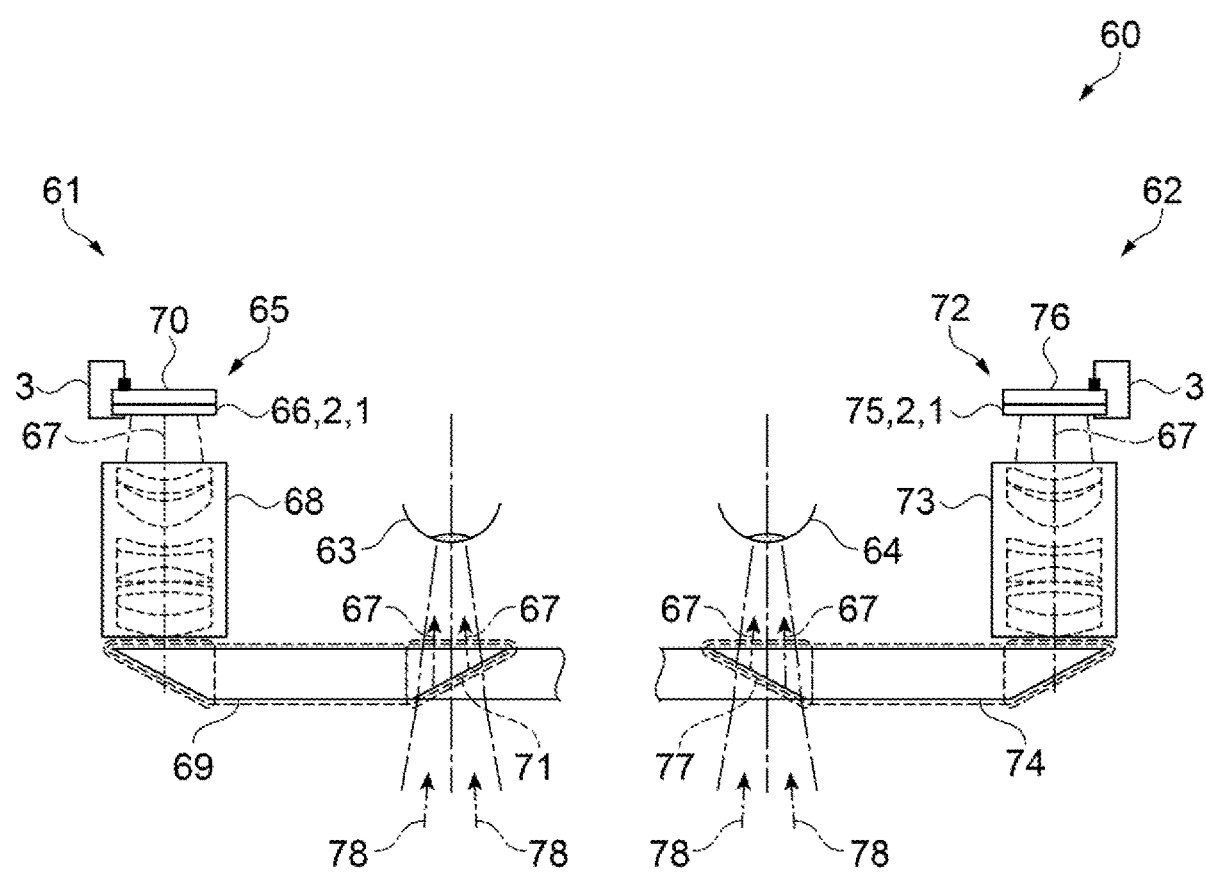
FIG. 6 is a plan view schematically illustrating a structure of an optical system of an HMD according to a fourth embodiment.

An embodiment of a Head Mounted Display (HMD), which is an electronic apparatus in which an electro-optical device is disposed, will be described with reference to FIG. 6. FIG. 6 is a plan view schematically illustrating a structure of an optical system of the HMD. In FIG. 6, a left eye and a right eye of a user are illustrated for explanation.

As illustrated in FIG. 6, an HMD 60 as the electronic apparatus includes a right display unit 61 and a left display unit 62 configured to be left-right symmetrical. The right display unit 61 allows a right eye 63 of the user to visually recognize an image. The left display unit 62 allows a left eye 64 of the user to visually recognize an image. The right display unit 61 includes a right video unit 65. The right video unit 65 includes an electro-optical device 66 and a right OLED driving circuit 70. The electro-optical device 1 in the first embodiment is used for the electro-optical device 66. The electro-optical device 66 emits image light 67. The image light 67 indicates light that forms an image on retinas of the right eye 63 and the left eye 64. The right display unit 61 includes a right optical system 68 and a right light-guiding plate 69. The right optical system 68 includes a group of lenses that guide the image light 67, and the like. The image light 67 is guided by the right optical system 68 to the right light-guiding plate 69.

The right OLED driving circuit 70 drives the electro-optical device 66. In the electro-optical panel 2 of the electro-optical device 66, light-emitting elements that each emit red, green, and blue light by organic electro-luminescence, are arrayed in a matrix pattern. The electro-optical panel 2 includes a plurality of pixels, each of which has a unit of three light-emitting elements that each emit red, green, and blue light. The electro-optical panel 2 forms an image by the pixels arrayed in a matrix pattern.

The right OLED driving circuit 70 inputs image data. The right OLED driving circuit 70 performs selection and energization of the light-emitting elements included in the electro-optical panel 2 to cause the light-emitting elements of the electro-optical panel 2 to emit light. The right OLED driving circuit 70 is disposed at a back side of a light-emitting surface of the electro-optical panel 2. The right OLED driving circuit 70 is electrically coupled with the electro-optical panel 2 by the flexible wiring substrate 3. The right OLED driving circuit 70 is constituted by a semiconductor device that drives the electro-optical panel 2.

The right optical system 68 includes a collimate lens configured to render the image light 67 emitted from the electro-optical panel 2 into light fluxes in a parallel state. The image light 67 rendered into light fluxes in a parallel state by the collimate lens enters the right light-guiding plate 69. In an optical path for guiding light inside the right light-guiding plate 69, a plurality of reflective faces for reflecting the image light 67 are arranged. The image light 67 is reflected a plurality of times inside the right light-guiding plate 69 to be guided to a side of the right eye 63. The right light-guiding plate 69 includes a half mirror 71 disposed in front of the right eye 63. In the right light-guiding plate 69, the image light 67 is reflected by the half mirror 71 to be emitted toward the right eye 63. The image light 67 forms an image on the retina of the right eye 63, allowing the user to visually recognize an image.

The left display unit 62 has a structure similar to that of the right display unit 61. The left display unit 62 includes a left video unit 72, a left optical system 73, and a left light-guiding plate 74. The left video unit 72 includes an electro-optical device 75 and a left OLED driving circuit 76. The electro-optical device 1 in the first embodiment is used for the electro-optical device 75. In the electro-optical device 1, the electro-optical panel 2 emits the image light 67. The left optical system 73, which includes a group of lenses and the like, guides the image light 67 emitted from the electro-optical device 75 to the left light-guiding plate 74.

The left OLED driving circuit 76 inputs image data. The left OLED driving circuit 76 performs selection and energization of the light-emitting elements included in the electro-optical panel 2 to cause the light-emitting elements of the electro-optical panel 2 to emit light. The left OLED driving circuit 76 is disposed at the back side of the light-emitting surface of the electro-optical panel 2. The left OLED driving circuit 76 is a circuit similar to that of the right OLED driving circuit 70.

The left optical system 73 includes a collimate lens configured to render the image light 67 emitted from the electro-optical panel 2 into light fluxes in a parallel state. The image light 67 rendered into light fluxes in a parallel state by the collimate lens enters the left light-guiding plate 74. In an optical path for guiding light inside the left light-guiding plate 74, a plurality of reflective faces for reflecting the image light 67 are arranged. The image light 67 is reflected a plurality of times inside the left light-guiding plate 74 to be guided to a side of the left eye 64. The left light-guiding plate 74 includes a half mirror 77 disposed in front of the left eye 64. In the left light-guiding plate 74, the image light 67 is reflected by the half mirror 77 to be emitted toward the left eye 64. The image light 67 forms an image on the retina of the left eye 64, allowing the user to visually recognize an image.

The HMD 60 functions as a display device of a see-through type. On the right eye 63 of the user, the image light 67 reflected by the half mirror 71 and external light 78 passed through the right light-guiding plate 69 are incident. On the left eye 64, the image light 67 reflected by the half mirror 77 and the external light 78 passed through the half mirror 77 are incident. The HMD 60 superimposes the image light 67 and the external light 78 to cause the superimposed light to enter the eyes of the user. This allows the user to see an external view through the right light-guiding plate 69 and the left light-guiding plate 74, enabling an image due to the image light 67 to be visually recognized in a manner overlapped with the external view. The half mirror 71 and the half mirror 77 serve as an image extracting unit configured to reflect image light output from each of the right display unit 61 and the left display unit 62 to extract an image.

The HMD 60 includes the electro-optical device 1 in the first embodiment. Even when the flexible wiring substrate 3 bends in the thickness direction of the silicon substrate 5, the electro-optical device 1 can prevent the second protective sheet 17 from overlapping with the silicon substrate 5 to cause a connection failure. Thus, the HMD 60 can serve as an apparatus including the electro-optical device 1 that can prevent the occurrence of connection failure even when the flexible wiring substrate 3 bends in the thickness direction of the silicon substrate 5.

Modification 1

In the first embodiment described above, the insulating member 18 contains a photosensitive resin material. The insulating member 18 may contain a thermosetting resin material in place of the photosensitive resin material. The insulating member 18 can be cured by heating even when the light 51 is not easily applied.

Modification 2

In the first embodiment described above, the insulating member 18 contains a solder resist. The insulating member 18 may be a resin material that does not contain a solder resist. A resin material that is easy to be applied may be used.

Modification 3

In the first embodiment described above, the second protective sheet 17 is formed of a resin film containing a polyimide. The second protective sheet 17 may be formed of a resin film containing a material other than a polyimide. A resin material that is easily obtained may be used for the second protective sheet 17, which is not required to have a heat resistance.

Modification 4

In the fourth embodiment described above, the electro-optical device 1 in the first embodiment is used for the electro-optical device 66 and the electro-optical device 75. The electro-optical device 25 in the second embodiment may be used for the electro-optical device 66 and the electro-optical device 75. The electro-optical device 30 in the third embodiment combined with a light source may be used for the electro-optical device 66 and the electro-optical device 75. Even when the flexible wiring substrate 32 bends in the thickness direction of the substrate for liquid crystal panel 34, the electro-optical device 1 can prevent the second protective sheet 17 from overlapping with the substrate for liquid crystal panel 34 to cause a connection failure. Thus, the HMD 60 can serve as an apparatus including the electro-optical device 30 that can prevent the connection failure from occurring even when the flexible wiring substrate 32 bends in the thickness direction of the substrate for liquid crystal panel 34.

Modification 5

In the fourth embodiment described above, the HMD 60 is exemplified as an example of an electronic apparatus including the electro-optical device 1. The electro-optical device 1, the electro-optical device 25, and the electro-optical device 30 may be used for other electronic apparatuses. For example, the electro-optical device 1, the electro-optical device 25, or the electro-optical device 30 may be used for projection-type display apparatuses, projection-type Head-Up Displays (HUD), mobile telephones, information mobile terminals, Personal Digital Assistants (PDA), digital cameras, liquid crystal televisions, car navigation apparatuses, television telephones, and the like. At this time as well, the connection failure can be prevented from occurring even when the flexible wiring substrate 3, the flexible wiring substrate 26, or the flexible wiring substrate 32 bend in the thickness direction.

Contents derived from the embodiments will be described below.

A flexible wiring substrate includes a base member having flexibility, a wiring disposed on the base member, a protective member covering the wiring, and an insulating member partially covering the wiring exposed from the protective member, and being thinner in thickness than the protective member.

According to the above configuration, the flexible wiring substrate includes a base member having flexibility. A wiring is disposed on the base member. A protective member is disposed covering the wiring. The protective member protects the wiring. The wiring is partially exposed. An insulating member is disposed partially covering the wiring exposed from the protective member. For example, the wiring of the flexible wiring substrate is electrically coupled with a semiconductor substrate-side terminal disposed at a semiconductor substrate. When a side face of the semiconductor substrate is positioned between the semiconductor substrate-side terminal and the protective member, the insulating member of the flexible wiring substrate makes contact with the side face of the semiconductor substrate. The insulating member prevents the wiring from being short-circuited with the semiconductor substrate. The insulating member is thinner in thickness than the protective member.

The exposed part of the wiring is electrically coupled with the semiconductor substrate-side terminal via an anisotropic conductive film or the like. For example, the protective member is thicker in thickness than the semiconductor substrate-side terminal. When the protective member is disposed near the semiconductor substrate-side terminal, the protective member makes contact with the semiconductor substrate to cause the base member to bend, thus generating an internal stress in the base member. This allows a stress to be exerted on a connection portion between the semiconductor substrate-side terminal and the wiring to make the connection portion easily peeled off. When the semiconductor substrate-side terminal and the protective member are arranged to be separated from each other, the base member, which bends in a small amount, prevents an internal stress from being generated in the base member.

When the insulating member makes contact with the semiconductor substrate, the base member bends in a small amount due to the insulating member being thin in thickness. The internal stress generated in the base member is also small. This prevents a stress form being applied to the connection portion between the semiconductor substrate-side terminal and the wiring, and thus the connection portion is hardly peeled off. Disposition of the insulating member makes it possible to separate the protective member from the side face of the semiconductor substrate. This makes it possible to prevent the protective member from overlapping with the semiconductor substrate-side terminal to cause a connection failure.

In the flexible wiring substrate described above, the insulating member may partially overlap in a plan view of the base member with the protective member.

According to the above configuration, the insulating member partially overlaps in a plan view of the base member with the protective member. The wiring, which is covered by one of the insulating member or the protective member, makes it possible to prevent an exposure of the wiring.

In the flexible wiring substrate described above, the insulating member may cover a side face of the protective member.

According to the above configuration, the insulating member covers the side face of the protective member. At this time, the insulating member makes contact with the protective member, thus makes it possible to prevent the wiring from being exposed at a boundary between the insulating member and the protective member.

In the flexible wiring substrate described above, the insulating member may contain a photosensitive resin material.

According to the above configuration, the insulating member contains a photosensitive resin material. A photosensitive resin is cured by being irradiated with light. Because the photosensitive resin is cured in a short time compared to a thermosetting resin, the insulating member 18 can be disposed with high productivity.

In the flexible wiring substrate described above, the insulating member may contain a solder resist.

According to the above configuration, the insulating member contains a solder resist. The solder resist can be easily applied by printing. Thus, the insulating member can be disposed with high productivity.

In the flexible wiring substrate described above, a plurality of terminals may be provided, and the insulating member may be provided along a direction in which the plurality of terminals are aligned.

According to the above configuration, the flexible wiring substrate includes a plurality of terminals. The terminals of the wiring are electrically coupled with the semiconductor substrate-side terminals of the semiconductor substrate via an anisotropic conductive film or the like. The semiconductor substrate-side terminals are aligned along the side face of the semiconductor substrate. Then, the insulating member is provided along a direction along which the plurality of terminals of the flexible wiring substrate are aligned. The insulating member is disposed along the side face of the semiconductor substrate. When the flexible wiring substrate bends in a thickness direction of the semiconductor substrate, the side face of the semiconductor substrate makes contact with the insulating member. This makes it possible to prevent the wiring from making contact with the side face of the semiconductor substrate.

In the flexible wiring substrate described above, the protective member may contain a polyimide.

According to the above configuration, the protective member contains a polyimide. A polyimide, which has flexibility and has high insulating properties, can function as a material for the flexible wiring substrate.

An electro-optical device includes an electro-optical panel including a semiconductor substrate and a panel-side terminal provided along a one side of the semiconductor substrate, and the flexible wiring substrate described above, in which a wiring of the flexible wiring substrate is electrically coupled with the panel-side terminal.

According to the above configuration, the electro-optical panel includes the semiconductor substrate. The panel-side terminal is provided along the one side of the semiconductor substrate. The wiring of the flexible wiring substrate is electrically coupled with the panel-side terminal. When the flexible wiring substrate bends in the thickness direction of the semiconductor substrate, the insulating member makes contact with the side face of the semiconductor substrate. This prevents the wiring from making contact with the semiconductor substrate.

In the electro-optical device described above, the insulating member included in the flexible wiring substrate may make contact with a corner portion of a side face of the semiconductor substrate.

According to the above configuration, the insulating member included in the flexible wiring substrate makes contact with the corner portion of the side face of the semiconductor substrate. Even when the insulating member makes contact with the semiconductor substrate, the wiring does not make contact with the semiconductor substrate. This prevents the wiring from being short-circuited.

An electronic apparatus includes the electro-optical device described above.

According to the above configuration, the electronic apparatus includes the electro-optical device described above. Even when the flexible wiring substrate bends in the thickness direction of the semiconductor substrate, the electro-optical device can prevent the protective member from overlapping with the semiconductor substrate to cause a connection failure. Accordingly, the electronic apparatus can serve as an apparatus including an electro-optical device that can prevent the connection failure from occurring even when the flexible wiring substrate bends in the thickness direction of the semiconductor substrate.

What is claimed is:

1. An electro-optical device, comprising:
   an electro-optical panel including:
     a semiconductor substrate, and
     a panel-side terminal provided along one side of the semiconductor substrate; and
   a flexible wiring substrate including:
     a wiring electrically connected to the panel-side terminal of the electro-optical panel,
     a protective member covering the wiring, and
     an insulating member partially covering the wiring exposed from the protective member, and being thinner in thickness than the protective member, the insulating member being disposed between the wiring and the semiconductor substrate of the electro-optical panel.

2. The electro-optical device according to claim 1, wherein
   the electro-optical panel includes a base member, and
   in plan view of the base member, the insulating member partially overlaps the protective member.

3. The electro-optical device according to claim 2, wherein the insulating member covers a side face of the protective member.

4. The electro-optical device according to claim 1, wherein the insulating member includes a photosensitive resin material.

5. The electro-optical device according to claim 1, wherein the insulating member includes a solder resist.

6. The electro-optical device according to claim 1, comprising a plurality of terminals, wherein
   the insulating member is provided along a direction in which the plurality of terminals are aligned.

7. The electro-optical device according to claim 1, wherein the protective member includes a polyimide.

8. The electro-optical device according to claim 1, wherein
   the flexible wiring substrate includes a base member having flexibility, and
   the wiring is disposed over the base member.

9. The electro-optical device according to claim 8, wherein the insulating member included in the flexible wiring substrate contacts a corner portion of a side face of the semiconductor substrate.

10. An electronic apparatus, comprising the electro-optical device according to claim 8.

\* \* \* \* \*